United States Patent

Swart et al.

[11] Patent Number: 6,084,421
[45] Date of Patent: Jul. 4, 2000

[54] TEST SOCKET

[75] Inventors: Mark A. Swart, Anaheim Hills; Charles J. Johnston, Walnut; Gordon A. Vinther, Pasadena; Steve B. Sargeant, Los Alimitos, all of Calif.

[73] Assignee: Delaware Capital Formation, Inc., Wilmington, Del.

[21] Appl. No.: 09/044,874

[22] Filed: Mar. 20, 1998

Related U.S. Application Data

[63] Continuation-in-part of application No. 08/839,723, Apr. 15, 1997.

[51] Int. Cl.[7] .............................. G01R 31/02; G01R 1/073
[52] U.S. Cl. ............................................ 324/755; 324/758
[58] Field of Search .................................... 324/755, 754, 324/758, 761; 439/70, 72

[56] References Cited

U.S. PATENT DOCUMENTS

| | | | |
|---|---|---|---|
| 4,061,969 | 12/1977 | Dean | 324/758 |
| 4,397,519 | 8/1983 | Cooney | 324/761 |
| 4,496,903 | 1/1985 | Paulinski | 324/761 |
| 5,015,946 | 5/1991 | Janko | 439/72 |
| 5,252,916 | 10/1993 | Swart | 324/158 P |
| 5,500,605 | 3/1996 | Chang | 439/70 |

FOREIGN PATENT DOCUMENTS

| | | |
|---|---|---|
| 4401469A1 | 7/1994 | Germany . |
| 9407823 U1 | 8/1994 | Germany . |
| 195 11 565A | 10/1996 | Germany . |
| 62-76273 | 4/1987 | Japan . |
| 6-61321 | 3/1994 | Japan . |
| 6-88857 | 3/1994 | Japan . |
| 10-22021 | 1/1998 | Japan . |

*Primary Examiner*—Ernest Karlsen
*Attorney, Agent, or Firm*—Christie, Parker & Hale LLP

[57] ABSTRACT

A test socket for an integrated circuit package having an upper housing and a lower housing secured to the top and bottom surfaces, respectively, of a load board. The upper housing having a cavity for receipt of the integrated circuit package and including a hole in the base of the upper housing to allow a plurality of solid socket plungers to contact test sites on the integrated circuit package. The socket plungers are positioned within a plurality of channels formed in the lower housing and extend through a plurality of holes in the load board to contact the test sites. A plurality of springs are positioned in the channels of the lower housing below the socket plungers to provide a spring force to bias the socket plungers upwardly toward the integrated circuit package. A ball is positioned between the spring and a beveled edge of the plunger to aid in biasing the plunger. Electrically conductive cylindrical eyelets or plated through holes are positioned within the holes in the load board to guide the travel of the socket plungers and to transfer the test signals from the socket plungers to the load board.

18 Claims, 5 Drawing Sheets

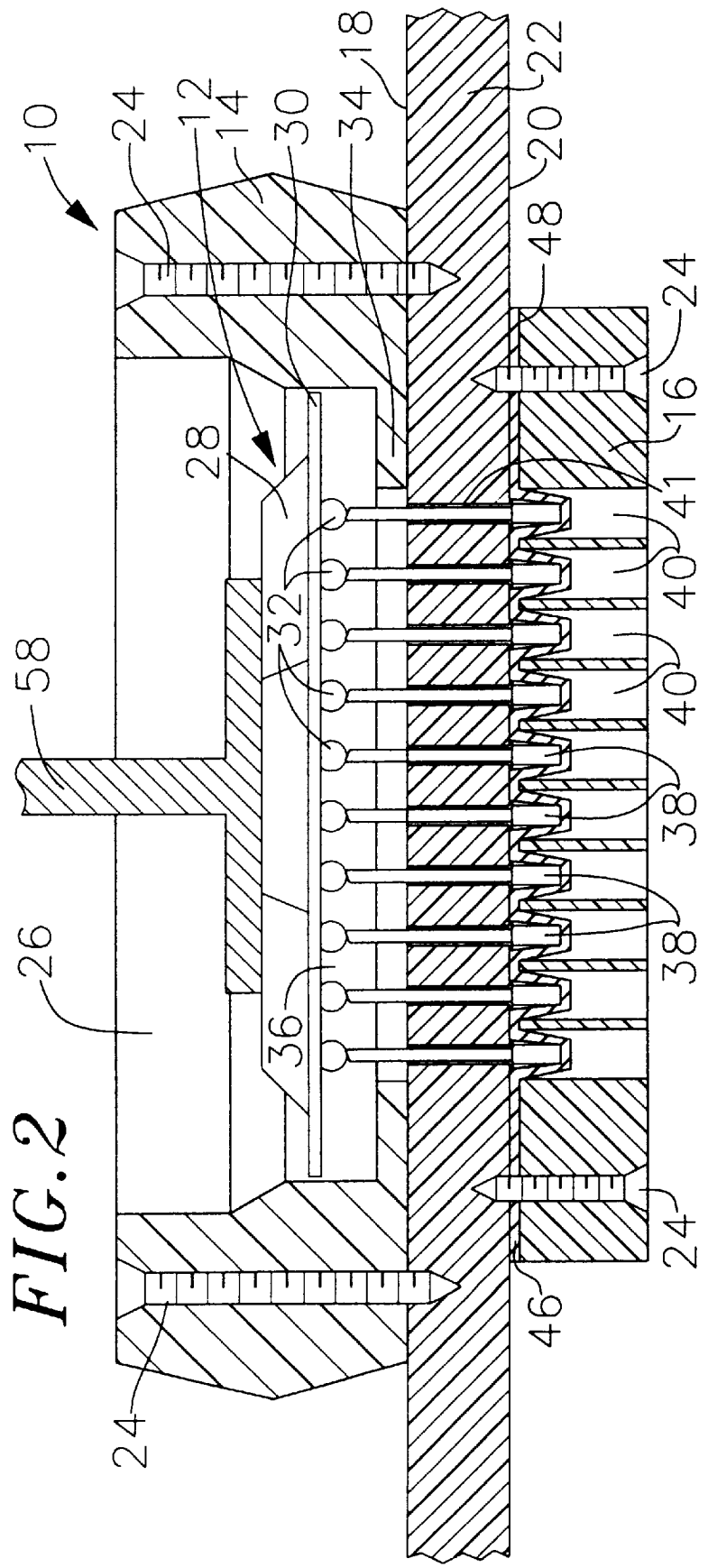

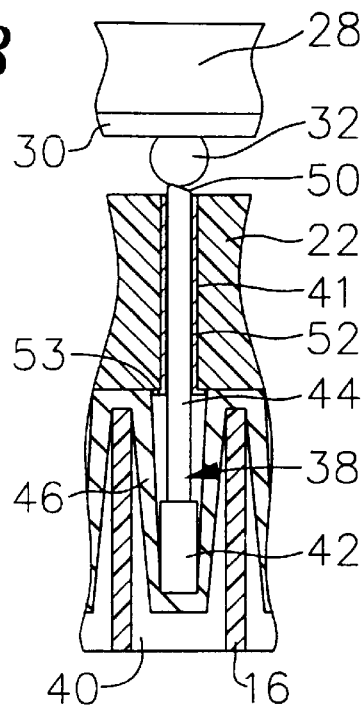
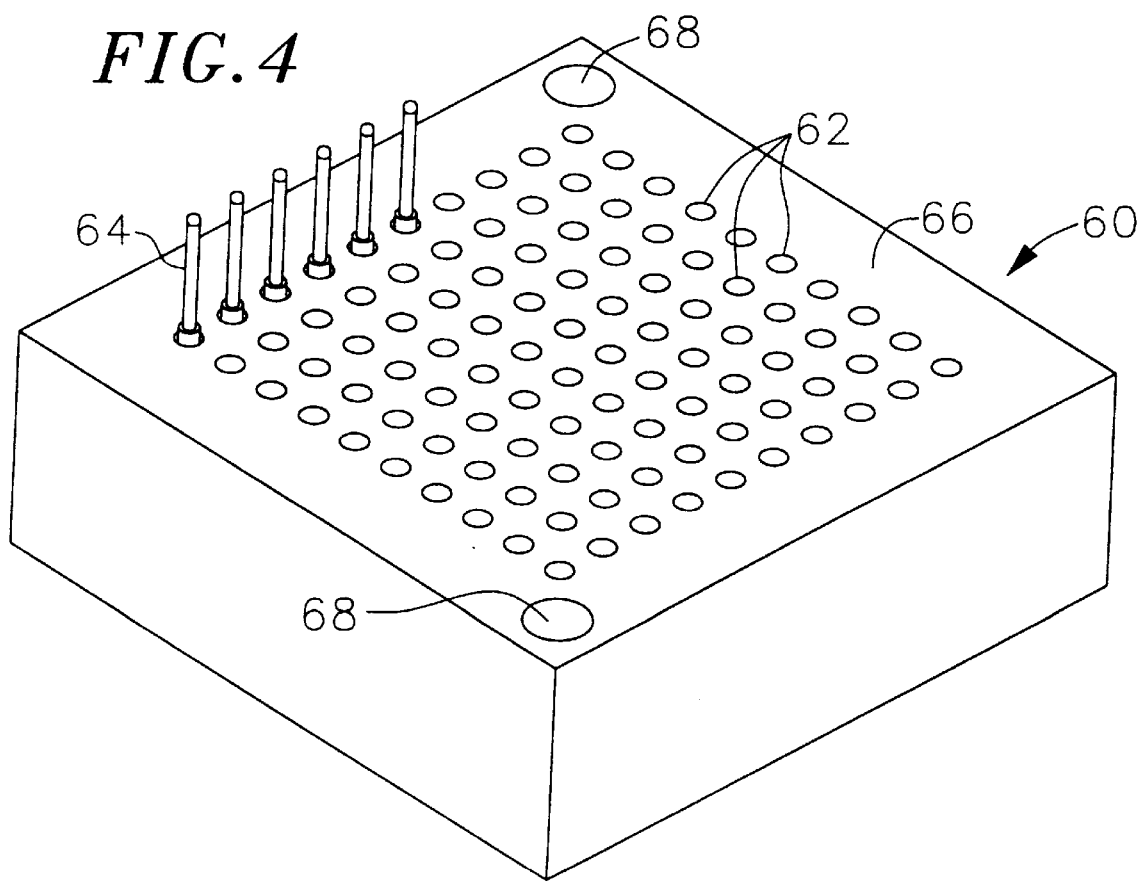

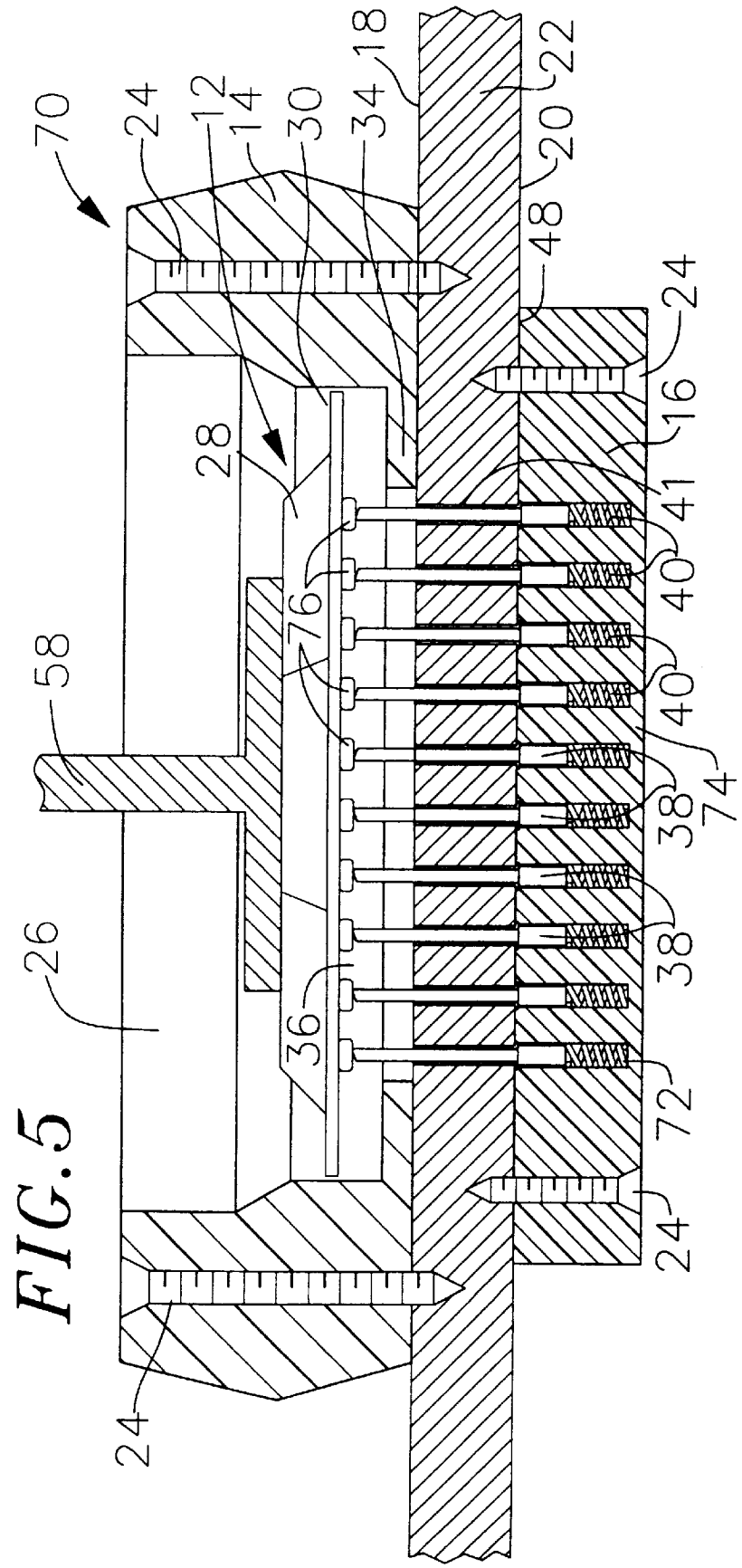

TEST SOCKET

CROSS REFERENCE TO RELATED APPLICATION

This application is a continuation-in-part of patent application Ser. No. 08/839,723 filed Apr. 15, 1997, pending.

FIELD OF THE INVENTION

This invention relates to test sockets for integrated circuit packages such as a ball grid array package wherein the socket includes an upper housing and a lower housing positioned around a load board and a plurality of solid contact pins extending through the load board from the lower housing and urged into contact with the integrated circuit package by a compliant element in the lower housing for applying independent spring forces to the solid contact pins of the test socket.

BACKGROUND OF THE INVENTION

Testing of integrated circuits contained within ball grid array (BGA) packaging is accomplished through the use of what is commonly referred to in the art as a test socket. BGA test sockets typically include a housing mounted to a load board which interfaces with the test electronics. The load board is generally a circuit board for transferring test signals from the integrated circuit in the BGA to the test electronics.

Previous methods of attaching the test socket to the load board include through hole techniques and surface mounting techniques. In the surface mounting connection, the test socket includes test pads which make contact with the solder balls on the bottom of the BGA as the BGA is compressed against the test pads to transfer the test signals to the load board. A problem associated with the surface mounting test socket arrangement is that the solder balls on the bottom of the BGA can vary in height and good electrical contact between each solder ball and the test pad cannot always be assured. A second problem associated with surface mounting is that once the test pads become contaminated from the solder balls, the entire socket assembly must be replaced.

Through hole techniques for connecting the socket to the load board include holes drilled through the load board for the passage of spring loaded contact pins which contact the solder balls on the BGA and transfer the test signals to the load board through the contact between the test pins and the holes in the load board. A problem associated with the through hole socket arrangement is that the test pins extending up through the load board could easily be bent or damaged which would negatively impact the test results. To avoid this problem, a receptacle can be positioned between the socket and the load board to protect the test pins extending through the load board. The result of incorporating a receptacle requires the length of the test pins in the socket to be increased which creates a problem for testing high speed integrated circuits. To address this problem spring probes have been incorporated which have a short travel length, however with short travel springs, the spring life is short requiring constant replacement. In addition, the use of spring probes in the socket can create an impedance problem for the transfer of the test signal from the BGA to the load board.

Consequently, a need exists for a new test socket for BGA packages which reduces the problems associated with prior art test sockets.

SUMMARY OF THE INVENTION

The present invention provides a newly designed test socket, and particularly a test socket for ball grid array integrated circuit packages which reduces the problems associated with prior test socket arrangements. Although in a preferred embodiment the test socket is designed for use with BGA packages, the socket can also be adapted for use with other integrated circuit packages such as, for example, QFP packages. Briefly, the test socket of the present invention includes an upper housing and a lower housing secured to the top and bottom surfaces respectively of a load board. The load board is a small circuit board which electrically interfaces with the test electronics of an external tester. The upper housing includes a cavity for receipt of the BGA and includes a hole in the lower surface to allow a plurality of solid socket plungers to contact the solder balls on the bottom of the BGA. The socket plungers are positioned within a plurality of channels formed in rows and columns in the lower housing and extend through a plurality of holes also in rows and columns through the load board to contact the solder balls. An elastomeric diaphragm is positioned between the upper surface of the lower housing and the lower surface of the load board and extends over and into the channels in the lower housing below the plungers to provide a spring force to bias the socket plungers upwardly toward the BGA. The flexible diaphragm provides independent spring biased pressure contact for the movable socket plungers mounted in the lower housing. Alternatively and more preferably, springs are positioned in the lower housing below the plungers to bias the plungers. A non-conductor ball is positioned between the plunger and the spring to prevent interference in high frequency applications. Electrically conductive cylindrical eyelets are positioned within the holes in the load board to guide the travel of the socket plungers and to transfer the test signals from the socket plunger to the load board. Alternatively, the through holes in the load board are plated for test signal transfer.

The socket plunger of the present invention eliminates the problems associated with prior BGA test socket arrangements by eliminating the long lead length and spring inductance problems by incorporating a solid socket plunger biased by an elastomeric diaphragm. This arrangement also provides for a long travel length for the plunger to compensate for lack of coplanar solder balls on the BGA. The use of an elastomeric diaphragm also increases the useful life of the test socket when compared to mechanical springs.

In addition, the present test socket arrangement provides for an easy and inexpensive refurbishment of the test socket due to the simple replacement of the plungers when contaminated by the solder balls. The socket plungers are simply replaced by removing the lower housing and elastic diaphragm which allows for the plungers to freely fall from the test socket. A refill cassette including new plungers, is then positioned over the lower surface of the load board which can be then inverted to refill the test socket with new plungers. The elastic diaphragm and lower housing can then be reinstalled to the load board for additional testing. The current design provides for refurbishment by simply replacing the plungers instead of the entire socket assembly. These and other advantages of the present invention will be more clearly understood by reference to the following detailed description.

BRIEF DESCRIPTION OF THE DRAWINGS

FIG. 2 is a cross sectional front view of the test socket of FIG. 1 in a non-biased condition;

FIG. 3 is an enlarged detail illustrating the socket plunger assembly;

FIG. 4 is a perspective view of a refill cassette for the test socket;

FIG. 5 is a cross-sectional front view of an alternative test socket arrangement.

DETAILED DESCRIPTION

Figure 1:
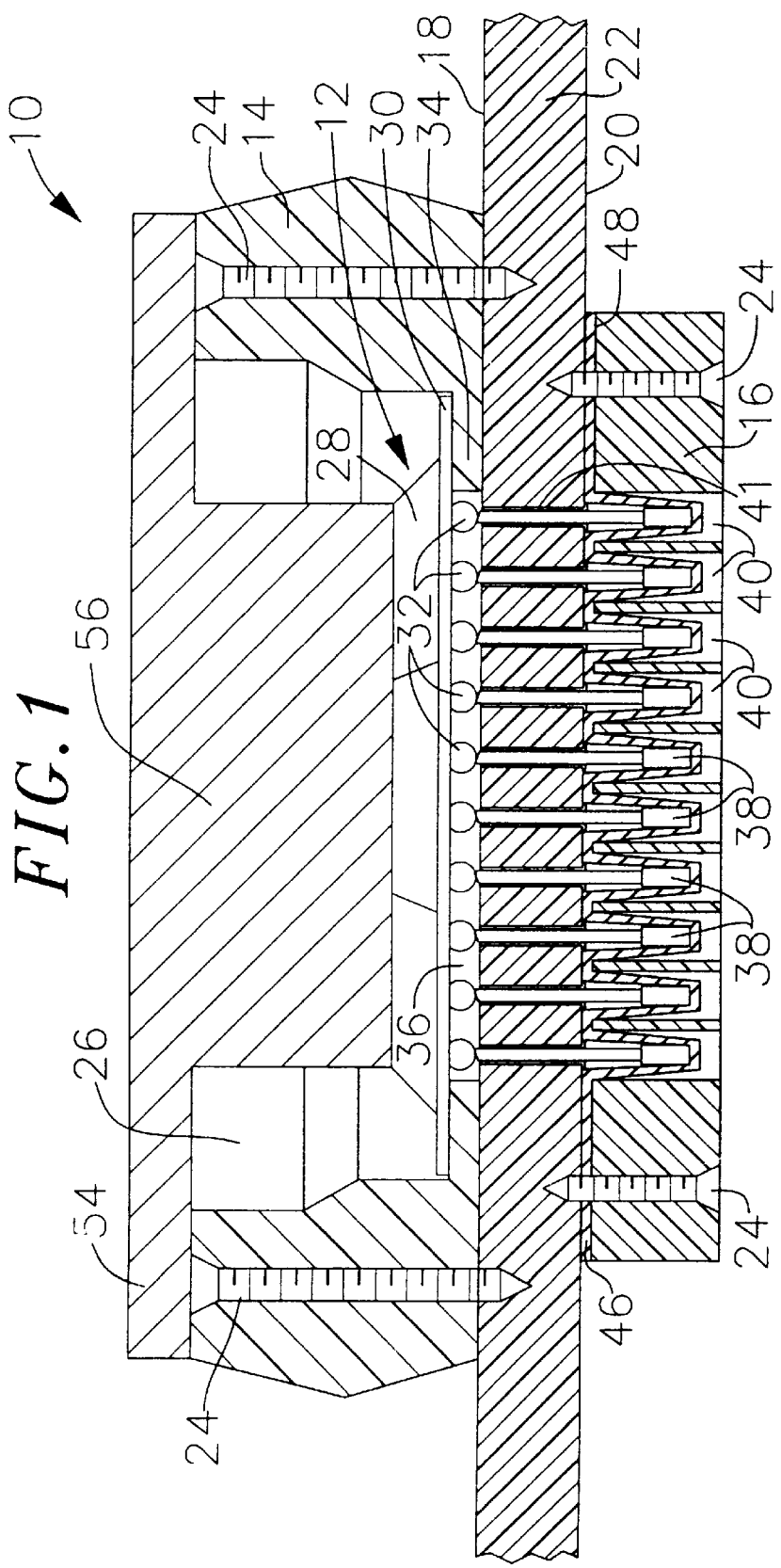
FIG. 1 is a cross sectional front view of the BGA test socket of the present invention in a biased condition.

The test socket 10 for a ball grid array integrated circuit package 12 is shown in FIGS. 1 and 2. Although the invention is described and illustrated for use with a BGA package, the novel design of the test socket is equally applicable for testing other integrated circuit packages. For clarity the majority of the detailed description will be limited to BGA packages. The test socket 10 of the present invention, includes an upper housing 14 and a lower housing 16 secured to the top 18 and bottom 20 surfaces respectively of a load board 22. The upper housing 14 and the lower housing 16 are preferably made of plastic and are rigidly secured to the load board by screws 24 passing through the housing and into the load board. The load board is a circuit board which electrically interfaces with test electronics of an external tester (not shown).

The upper housing includes a cavity 26 within the interior of the upper housing for receipt of the ball grid array package 12. The ball grid array package comprises an integrated circuit 28 positioned on a substrate 30 and having a plurality of solder balls 32 positioned on the lower surface of the substrate opposite the integrated circuit and in electrical communication with the integrated circuit through the substrate 30. The solder balls 32 serve as test pads for testing the integrated circuit. The substrate 30 rests on a flange 34 at the base of the cavity 26 and the solder balls 32 extend through a hole 36 defined by the flange 34 above the upper surface 18 of the load board 22.

The hole 36 in the base of the upper housing also provides an opening to allow a plurality of solid socket plungers 38 to contact the solder balls 32. The socket plungers are positioned within a plurality of channels 40 formed in rows and columns in the lower housing 16 and extend through a plurality of holes 41 through the load board to contact the solder balls 32 as seen best in FIG. 3. Holes 41 are also positioned in rows and columns similar to the pattern of solder balls 32 on the BGA package. The solid socket plunger 38 comprises an enlarged head portion 42 and a smaller diameter elongated arm portion 44. The arm portion extends through the hole 41 in the load board 22 while the enlarged head portion 42 remains within the channel 40 in the lower housing 16.

An elastomeric diaphragm 46 is positioned between the upper surface 48 of the lower housing 16 and the lower surface 20 of the load board and extends over and into channels 40 in the lower housing below the head portion 42 of the socket plungers to provide a spring force to bias the socket plungers upwardly toward the BGA such that the angled top surface 50 of the plunger arm 44 makes good electrical contact with the solder ball 32. The angled surface 50 on the end of the plunger arm is machined to provide biasing contact with the solder balls. The flexible diaphragm 46 provides independent spring bias pressure contact for the moveable socket plungers mounted in the lower housing. Electrically conductive cylindrical eyelets 52 are positioned through each hole 41 in the load board 22 to guide the travel of the socket plunger arms and to transfer the test signals generated from the solder balls through the socket plungers to the load board. The eyelets are preferably made from an electrically conductive material such as cooper beryllium or nickel silver. The through holes 41 in the load board are typically plated and the eyelet includes a solder preform ring 53 which solders the eyelet to the plated through hole to rigidly secure the eyelet to the load board.

The elastomeric diaphragm 46 is held between the lower housing and the load board by the screws 24. The elastomeric diaphragm is preferably a thin flexible sheet of expandable latex rubber which makes direct contact with the socket plunger heads 42. Although the elastomeric diaphragm preferable is made of latex rubber, other materials which allow the diaphragm to provide a biasing spring force to the socket plungers is contemplated. The diaphragm in its normal position stretches to conform to the shape of each plunger head portion and an axial force applied to each plunger in the direction of the diaphragm during use causes the diaphragm to stretch and provide a compliancy for the ends of the plungers in a manner similar to a common return spring. In response to axial movement of the plunger, the thin, flexible diaphragm is freely expandable into the channels 40 in the lower housing so that the diaphragm can freely expand or stretch into the void space of each channel. The axial force is applied to the socket plungers by, in one embodiment as shown in FIG. 1, a housing lid 54 hingedly connected to the upper housing 14 and secured to the upper housing in a closed position by a clasp (not shown). The lid 54 includes an enlarged center section 56 sized to push the BGA package downwardly against the socket plungers thereby stretching the elastic diaphragm. Alternatively, the axial force can be applied to the BGA package by a robotic arm 58 positioned above the BGA package and extending into the upper housing through the cavity 26 as shown in FIG. 2. In this configuration, no housing lid is necessary, or would be held in an open position. Use of a robotic arm would be incorporated into an automated testing configuration. The elastic diaphragm in FIG. 2 is shown in its normal position prior to the axial force being applied to the BGA package.

The test socket arrangement of the present invention provides for easy and inexpensive refurbishment of the test socket due to the ability to easily replace the socket plungers when they become contaminated by the solder balls 32. Through repeated use, the angled surface 50 of the socket plunger can become contaminated from tin or lead deposits from the solder balls. Refurbishment can be easily accomplished through the use of a refill cassette 60 shown in FIG. 4. The refill cassette 60 is preferably a plastic block containing a plurality of recesses 62 formed in columns and rows extending into the refill cassette for the receipt of replacement socket plungers 64. FIG. 4 illustrates six replacement socket plungers extending upwardly out of the recesses 62 for illustration purposes. It is to be understood that a separate socket plunger 64 would be positioned within each recess 62 and would be flush with the upper surface 66 of the refill cassette. The refill cassette also includes locating holes 68 to align the refill cassette during the refurbishment process.

To refurbish the test socket, the contaminated socket plungers are simply replaced by removing the lower housing and the elastic diaphragm thereby allowing the contaminated plungers to freely fall from the test socket. The refill cassette is then positioned over the lower surface of the load board and then inverted to refill the test socket with the new plungers. The elastic diaphragm and the lower housing are then reinstalled to the load board for additional testing.

Referring to FIG. 5, a first alternative test socket arrangement is shown. The test socket 70 of FIG. 5 is similar to the test socket of FIGS. 1 and 2 except the compliant means is a spring 72 positioned within channels 40 in the lower housing 16. In this embodiment the upper surface 48 of the lower housing is adjacent the lower surface 20 of the load board 22. Channels 40 in the lower housing are blind holes that do not extend all the way through the lower housing but terminate at a floor portion 74. Although this test socket could be used to test BGA packages, FIG. 5 illustrates that other integrated circuit packages can be tested having other types of test sites 76, which could, for example, be test pads or leads.

Figure 6:
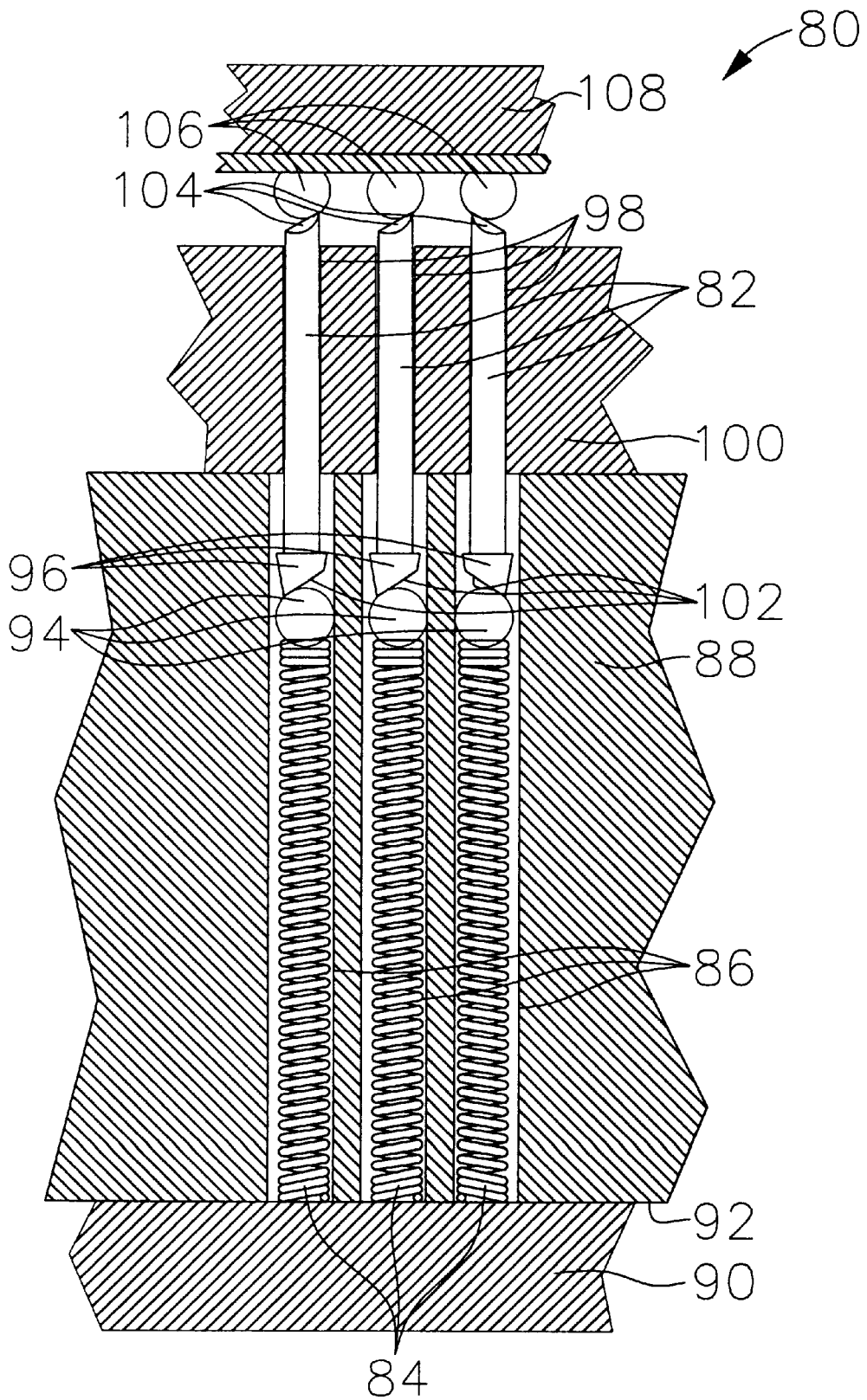
FIG. 6 is a partial cross-sectional detail of an alternative configuration to bias the plunger.

A second alternative and preferred test socket configuration 80 is shown in FIG. 6. The test socket 80 is substantially similar to the socket of FIGS. 1, 2 and 5 and includes a different arrangement for biasing the plunger 82. Each plunger is biased by a spring 84 positioned within a hole 86 extending through the lower housing 80. Springs 84 are retained within holes 86 by a retention cap 90 secured to the lower surface 92 of the lower housing by screws (not shown). Retention cap 90 covers the rows and columns of holes 86 in the lower housing.

A ball 94 is positioned between the plunger head 96 and the spring 84. The ball biases the plunger against the plated through holes or eyelets 98 in the load board 100 by contacting a beveled surface 102 on the bottom of the plunger head 96. The balls can be metal, or a non-conductive material, such as ceramic, for high frequency applications to prevent interference with the test signal. The plunger also has a beveled end 104 to contact the solder balls 106 of the integrated circuit 108. Beveled ends 104 ensure good contact with the test sites.

Although the present invention has been described and is illustrated with respect to three embodiments thereof, it is to be understood that it is not to be so limited, since changes and modifications may be made therein which are within the full intended scope of this invention as hereinafter claimed.

What is claimed is:

1. A test socket for an integrated circuit package having a plurality of test sites comprising:
   an upper housing positioned on a printed circuit board having a cavity for receipt of the integrated circuit package;
   a lower housing positioned below the printed circuit board having a plurality of channels for receipt of solid test pins; and
   compliant means positioned below the printed circuit board for urging the test pins through the printed circuit board and into electrical contact with the test sites on the integrated circuit package for transmission of test signals from the test sites through the test pins and the printed circuit board.

2. The test socket of claim 1 wherein the circuit board includes a plurality of holes, each hole having an electrically conductive eyelet for guiding the travel of the test pins through the circuit board and transferring test signals from the test sites of the integrated circuit package to the circuit board.

3. The test socket of claim 1 wherein the circuit board includes a plurality of plated through holes for guiding the travel of the test pins through the circuit board and transferring test signals from the test sites to the circuit board.

4. The test socket of claim 1 wherein compliant means is a spring positioned within each channel of the lower housing below the test pins.

5. The test socket of claim 4 further including a ball positioned between the spring and the test pins.

6. The test socket of claim 1 wherein the ball is made of a non-conductive material.

7. The test socket of claim 5 wherein the test pins have a beveled edge for contacting the ball.

8. A test fixture for a integrated circuit package having a plurality of test sites positioned on a lower surface of the integrated circuit package comprising:
   an upper housing positioned on a printed circuit board having a cavity for receipt of the integrated circuit package, the cavity extending into an opening for the test sites in the base of the upper housing;
   a lower housing positioned below the printed circuit board having a plurality of channels, each channel including a solid test pin; and
   a spring positioned in each channel in the lower housing for applying an axial force to the test pins for electrical contact with the test sites, whereby test signals are transmitted from the test sites to the printed circuit board through the test pins.

9. The test fixture of claim 8 further including a ball positioned between each spring and each test pin in the channels.

10. The test fixture of claim 8 wherein the circuit board includes a plurality of plated through holes for guiding the travel of the test pins through the circuit board and transferring test signals from the integrated circuit package to the circuit board.

11. The test fixture of claim 9 wherein the ball is made of a non-conductive material.

12. The test fixture of claim 9 wherein the test pins have a beveled edge for contacting the ball.

13. The test fixture of claim 8 further comprising a retention cap positioned on a lower surface of the lower housing adjacent the channels.

14. A test socket for a ball grid array integrated circuit package comprising:
   an upper housing positioned on a load board having a cavity for receipt of the ball grid array integrated circuit package, the cavity extending into an opening in a base of the upper housing;
   a lower housing positioned below the load board having a plurality of channels for receipt of a solid test pin;
   the test pins having at least one beveled end;
   a spring positioned in each channel below the test pins; and
   a ball positioned in each channel between the spring and the beveled edge of the test pin, the spring and the ball urge the test pins into electrical contact with the ball grid array integrated circuit package through the load board.

15. The test socket of claim 14 wherein the ball is made from a non-conductive material.

16. The test socket of claim 14 wherein the circuit board includes a plurality of plated through holes for guiding the travel of the test pins through the circuit board and transferring test signals from the ball grid array integrated circuit package to the circuit board.

17. The test socket of claim 14 further comprising a retention cap secured to a lower surface of the lower housing adjacent the channels.

18. The test socket of claim 14 further comprising a housing lid positioned over the upper housing for compressing the ball grid array integrated circuit package against the test pins.

* * * * *